US006812064B2

(12) United States Patent  
Jiang et al.

(10) Patent No.: US 6,812,064 B2  
(45) Date of Patent: Nov. 2, 2004

(54) OZONE TREATMENT OF A GROUND SEMICONDUCTOR DIE TO IMPROVE ADHESIVE BONDING TO A SUBSTRATE

(75) Inventors: Tongbi Jiang, Boise, ID (US); Mike Connell, Boise, ID (US); Li Li, Meridian, ID (US); Curtis Hollingshead, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 17 days.

(21) Appl. No.: 10/008,136

(22) Filed: Nov. 7, 2001

(65) Prior Publication Data

US 2003/0087507 A1 May 8, 2003

(51) Int. Cl.[7] .......................... H01L 21/44; H01L 21/30; H01L 21/301; H01L 23/544
(52) U.S. Cl. .................. 438/118; 438/113; 438/68; 438/114; 438/458; 438/460; 257/620
(58) Field of Search ................ 438/68, 113, 114, 438/118, 458, 460, 106, 464, 462, FOR 340; 257/620, 782–784, 707, 753, 783

(56) References Cited

U.S. PATENT DOCUMENTS

| | | | | |
|---|---|---|---|---|
| 3,654,000 A | * | 4/1972 | Totah et al. ................. 438/464 |
| 4,749,640 A | * | 6/1988 | Tremont et al. ............. 430/314 |
| 4,904,610 A | * | 2/1990 | Shyr ........................... 156/155 |
| 5,362,526 A | * | 11/1994 | Wang et al. ................. 427/573 |
| 5,403,630 A | * | 4/1995 | Matsui et al. ............... 427/583 |
| 5,597,766 A | * | 1/1997 | Neppl ............... 148/DIG. 135 |
| 5,650,363 A | * | 7/1997 | Endroes et al. .............. 438/57 |
| 5,716,862 A | * | 2/1998 | Ahmad et al. .............. 438/303 |
| 5,863,970 A | * | 1/1999 | Ghoshal et al. ............. 523/434 |
| 6,034,195 A | * | 3/2000 | Dershem et al. ........... 524/439 |
| 6,036,173 A | * | 3/2000 | Neu et al. ................... 257/666 |
| 6,065,489 A | * | 5/2000 | Matsuwaka ................. 137/341 |
| 6,168,980 B1 | * | 1/2001 | Yamazaki et al. .......... 438/162 |
| 6,184,064 B1 | * | 2/2001 | Jiang et al. ................. 257/739 |
| 6,187,216 B1 | * | 2/2001 | Dryer et al. ................. 216/95 |
| 6,255,230 B1 | * | 7/2001 | Ikakura et al. ............. 438/765 |
| 6,294,469 B1 | * | 9/2001 | Kulkarni et al. ............ 438/689 |
| 6,313,010 B1 | * | 11/2001 | Nag et al. ............ 148/DIG. 50 |
| 6,376,335 B1 | * | 4/2002 | Zhang et al. ............... 438/471 |
| 6,414,374 B2 | * | 7/2002 | Farnworth et al. .......... 257/620 |
| 6,451,660 B1 | * | 9/2002 | Ma et al. .................... 438/343 |
| 6,500,694 B1 | * | 12/2002 | Enquist ...................... 438/109 |
| 6,524,968 B2 | * | 2/2003 | Takahashi et al. .......... 438/758 |
| 6,551,676 B1 | * | 4/2003 | Yamakawa et al. ........ 428/40.1 |
| 6,608,259 B1 | * | 8/2003 | Norskov ..................... 174/261 |
| 6,635,144 B2 | * | 10/2003 | Cui et al. ............. 156/345.25 |
| 2001/0052652 A1 | * | 12/2001 | Smith et al. ................ 257/783 |
| 2002/0000239 A1 | * | 1/2002 | Sachdev et al. ............... 134/2 |
| 2003/0000619 A1 | * | 1/2003 | Nakamura et al. .......... 152/525 |

FOREIGN PATENT DOCUMENTS

| | | | |
|---|---|---|---|
| JP | 356056660 | * | 5/1981 |
| JP | 60-176242 | * | 10/1985 |
| JP | 63-41028 | * | 2/1988 |
| JP | 05-160304 | * | 6/1993 |
| JP | 09-251995 | * | 9/1997 |
| JP | 10-178000 | * | 6/1998 |

* cited by examiner

Primary Examiner—Kamand Cuneo  
Assistant Examiner—James Mitchell  
(74) Attorney, Agent, or Firm—Dorsey & Whitney LLP

(57) ABSTRACT

Methods are provided to improve the adhesive bonding of a semiconductor die to a substrate through an adhesive paste by forming a layer of silicon dioxide on the back surface of the semiconductor die prior to applying the adhesive paste. Contacting the semiconductor die with ozone, in a gas mixture or in a mixture with water provides rapid oxidation of the silicon layer at the back of the semiconductor die to a silicon dioxide layer of at least 10 angstroms thick, which is sufficient to greatly improve bonding to the adhesive. The formation of a silicon dioxide surface layer prior to application of the adhesive is particularly beneficial when combined with rapid, snap curing processes, where the adhesive can be reliably cured by heating the semiconductor die for less than about 1 minute.

72 Claims, 5 Drawing Sheets

OZONE TREATMENT OF A GROUND SEMICONDUCTOR DIE TO IMPROVE ADHESIVE BONDING TO A SUBSTRATE

TECHNICAL FIELD

This invention relates generally to the field of semiconductor die manufacturing, and more particularly, to methods for treating the surface of a semiconductor with ozone to enhance bonding of the back surface of a semiconductor die to a substrate using an adhesive.

BACKGROUND OF THE INVENTION

One of the last steps in manufacturing semiconductor components is adhering the back surface of a completed semiconductor die to a substrate, which is ultimately encapsulated to form a packaged integrated circuit, or mounted directly onto a circuit board or other receiving component. The substrate may be a lead frame or laminated portion of the circuit board or other surface to which the back surface of the die will be adhered with an adhesive. Most typically, the substrate is a lead frame having a substrate surface to which the adhesive binds, and conductive leads to which bond wires extending to bond pads on the front surface of the semiconductor die will be connected. The conventional steps in adhering a semiconductor die to a substrate according to the prior art are explained with reference to FIG. 1A. Several semiconductor die are fabricated on a single wafer having a front surface with a cover layer (e.g., a passivation layer) deposited over fabricated circuit components and a back surface, which is ordinarily comprised of untreated silicon. The back surface of the wafer is polished 10 on a grinding machine and each of the semiconductor die present on the wafer are separated from each other by a dicing step 12. An adhesive paste is applied 20 to the substrate surface and the back surface of the semiconductor die is then attached 30 to the substrate. The adhesive paste is cured by a heating step 40 to harden the adhesive and adhere the semiconductor die to the substrate, which, when the substrate is a lead frame, occurs prior to connecting wires between the bond pads and the leads.

A variety of processes are used to perform the step 40 of curing the adhesive bond between the semiconductor die and the substrate. FIG. 1B illustrates a batch curing process in which individual wafers are processed through the grinding and adhesive application step until a sufficient number have been accumulated 25 to fill a batch oven. The accumulated wafers are then transferred to a curing oven where they are baked in batch 42 typically, for at least 2 hours with the first hour being at about 110° C. and the second hour being at about 165° C. Batch curing generally produces consistent adhesion between the semiconductor die and the substrates, however, batch curing has other drawbacks. One problem with batch curing is that hundreds or thousands of semiconductor die are exposed in a waiting room for the time required to accumulate enough wafers to fill the batch oven, which increases the chances of surface contamination and bleed. Another problem is that any error in the batch curing process could ruin the entire batch. Still another problem is that batch curing requires a long cycle time, typically about 6 hours between batches, which reduces the speed of manufacturing throughput.

An alternative to batch curing are the so called "snap curing" processes illustrated in FIGS. 1C and 1D, in which steps that are common to those of FIGS. 1A and 1B have provided with same reference numerals. In snap curing, each semiconductor die is attached to the substrate with the adhesive paste and immediately placed on a conveyor belt that transports each piece to a curing station 44 where it is incubated for a short period of about 1 to 5 minutes at temperatures of about 130 to 220° C. to rapidly cure the adhesive paste. An alternative method of snap curing sometimes used when the substrate is a lead frame, is depicted in FIG. 1D, where the snap cure station is replaced by a wire bonding machine, which is heated to about 150° C. for a time sufficient to attach conductive wires between the bond pads of the semiconductor die and the conductive leads of the lead frame. The advantage of using the wire bond machine to perform the snap curing that the process of curing and wire bonding can be performed using the same apparatus. More generally, the principal benefit of snap curing is increased speed of manufacturing throughput. A potential problem with snap curing, however, is occasional failure of the adhering layer due to lack of adequate curing, which may result in delamination of the semiconductor die from its substrate.

In a semiconductor manufacturing facility the above process are automated using various robotic devices. For example, the wafers are transferred from the grinding-machine to the adhesive application station by being momentarily attached and released by a pick-up tip of a wafer exchange machine. A problem sometimes encountered in semiconductor die manufacturing is unwanted stickiness of the back surface of ground wafers to the pick-up tips. Until the present invention, the cause of this stickiness was not adequately addressed.

There is therefore a need in the art to improve the adherence of semiconductor die to its substrates with an adhesive, especially for snap-curing applications, and to overcome the problem of stickiness of the back surface of ground wafers to pick-up tips.

SUMMARY OF THE INVENTION

The invention is based on the discovery that adherence of a completed semiconductor die to a substrate by use of an adhesive is enhanced if the back surface layer, typically comprised of silicon is oxidized to form a surface layer comprised of silicon dioxide prior to application of the adhesive. The silicon dioxide surface layer has the added benefit of not sticking to pick-up tips, which aids automated semiconductor manufacturing processes.

In a preferred practice, the back surface of the semiconductor die is oxidized to form a layer of silicon dioxide by contacting the semiconductor die with ozone. In one practice, the silicon dioxide surface layer is formed by contacting the semiconductor die with a gas mixture containing ozone. In another practice, the semiconductor die is contacted with a liquid solution comprising water and ozone. Contacting the semiconductor die with ozone forms a silicon dioxide layer of at least about 10 angstroms thickness in a time period of less than 10 minutes and typically within about 5 minutes. The silicon dioxide layer is formed by contacting the semiconductor die with ozone at room temperature (about 20° C. to about 30° C.). The silicon dioxide layer enhances the bonding of the semiconductor die to an adhesive. In other practices, the silicon dioxide layer is formed by any step that includes oxidizing the silicon layer on the back surface of the semiconductor die or depositing a layer of silicon dioxide of at least about 10 angstroms thickness prior to applying the adhesive. Also provided are systems that include a station adapted to receive a ground silicon die into a chamber configured to incubate the die in an environment that causes the formation of the silicon dioxide layer of at east 10 angstroms thickness on the back surface of the die prior to application of the adhesive.

The formation of the silicon dioxide layer on the back surface of the semiconductor die is preferably combined with rapid curing processes which include curing the adhesive for less than 5 minutes, or more typically, for about 10 seconds to about 30 seconds, at temperatures of about 130° C. or greater, most typically at about 150° C. The curing processes may occur in a wire bonding machine, a solder reflow oven, or in any place suitable for incubating the semiconductor die at a selected temperature.

BRIEF DESCRIPTION OF THE DRAWINGS

FIG. 1 illustrates methods of adhesive application to a semiconductor die according to the prior art.

DETAILED DESCRIPTION OF THE INVENTION

Figure 1A:
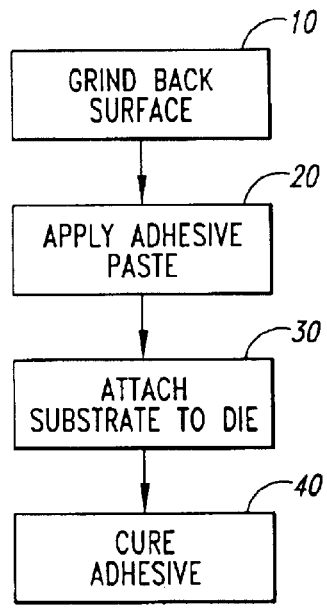
FIG. 1A depicts common steps in adhering the semiconductor die to its substrate.
Figure 1B:
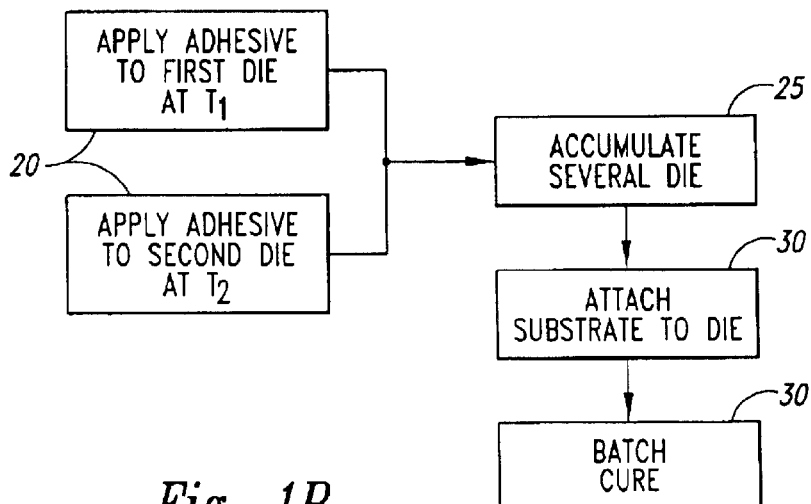
FIG. 1B depicts a batch curing process.
Figure 1C:
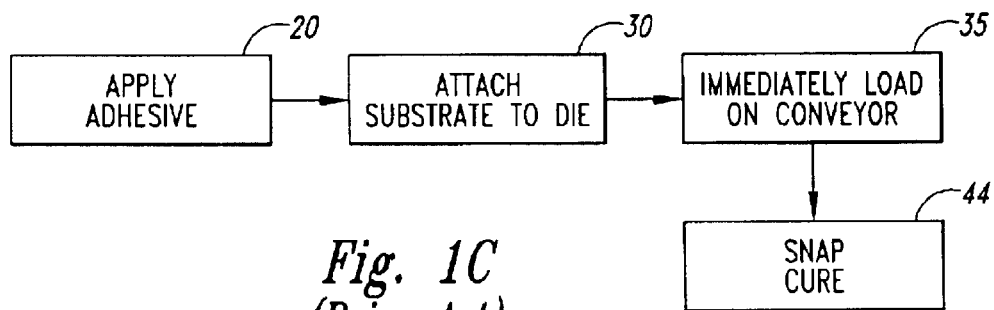
FIG. 1C depicts a snap curing process and FIG. 1D depicts a snap curing process conducted in a wire bonding machine.
Figure 1D:
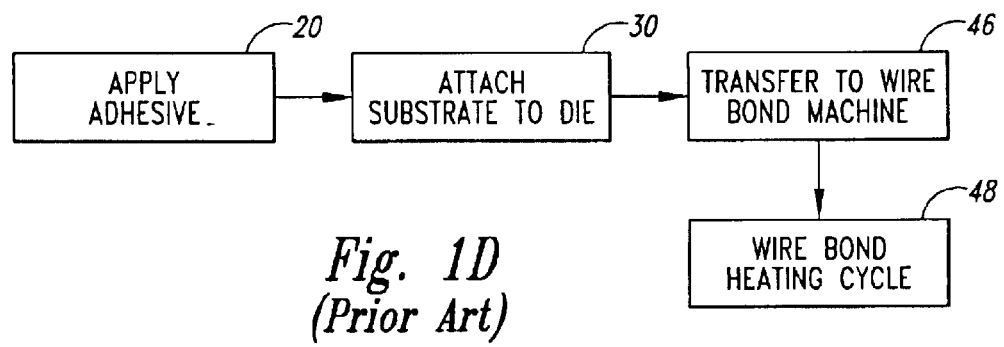
Figure 2:
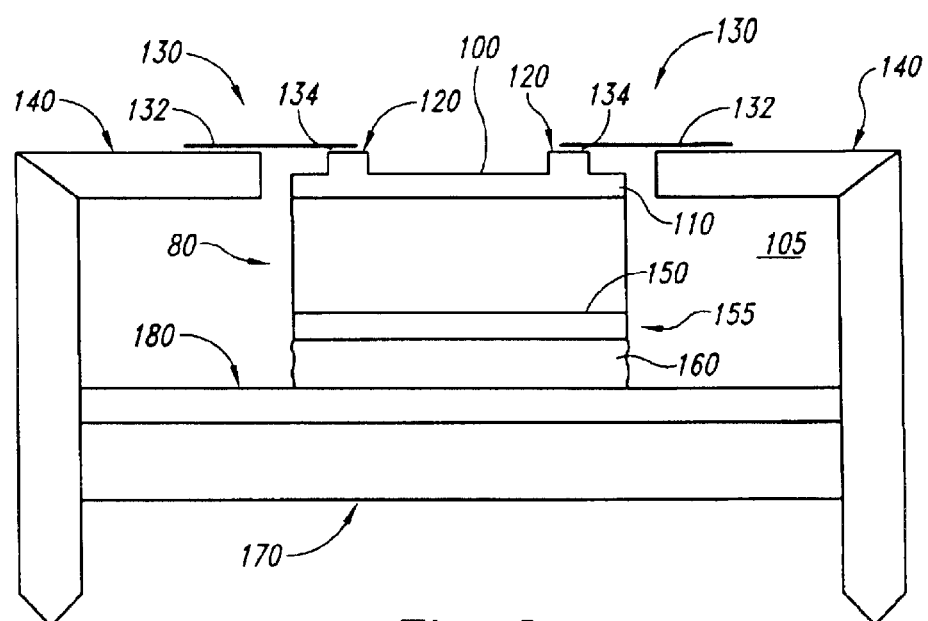
FIG. 2 is a schematic elevation view of a semiconductor die adhered to a substrate according to the methods of this invention.

The present invention is based on the discovery that oxidation of the back surface of a semiconductor die to form a layer of silicon dioxide increases the strength of the bond formed between the back of the semiconductor die and the adhesive, and therefore, also the adhesive bond between the semiconductor die and the substrate to which it is attached. FIG. 2 is a schematic elevation view of a semiconductor die 80 attached to a substrate 170 prepared by the methods disclosed herein. The substrate 170 in FIG. 2 is a lead frame having a surface 180 to which the semiconductor die is adhered, however, the methods disclosed herein are useful for any substrate to which a semiconductor die is adhered, including, but no limited to laminated surfaces of circuit boards and the surfaces of other semiconductor die. It will be understood that the Figures used throughout this disclosure are not drawn to scale, but rather are drawn to aid in understanding of various features of the invention. The semiconductor die 80 includes a front surface 100 having a cover layer 110 deposited over an intermediate layer 105, which has circuitry fabricated into the semiconductor die 80. The cover layer 110 may be a passivation layer, which is understood to be a layer of material deposited over a semiconductor device to protect the front surface of the device or reduce the chemical reactivity thereof. Typical cover layers 110 comprise materials such as nitrides, polyimides, BCB and silicon dioxide, however, the methods provided herein can be used with a cover layer 110 made of any material that protects the underlying circuitry. Bonding pads 120 formed on the front surface 110 electrically connect to the circuitry fabricated in the intermediate layer 105 and have a bonding surface 134 to which bonding wires 130 (or solder bumps, not shown) are used to electrically connect the bonding pads 120 to an external conductive lead 140. The semiconductor die 80 also has a back surface 150 opposite the front surface 100. The back surface 150 has a surface layer 155 which contacts an adhesive paste 160 to adhere the semiconductor die to the adhering surface 180 of the substrate 170.

Figure 3A:
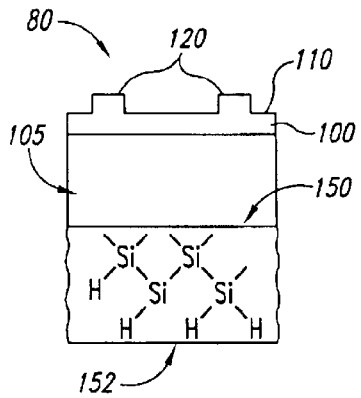
FIG. 3 is a schematic diagram illustrating oxidation of a silicon surface layer and subsequent curing with a silane containing adhesive to adhere a semiconductor die to a substrate according to the present invention.

Turning to FIG. 3A, the back surface 150 of a freshly ground semiconductor die 80 is typically comprised of a surface layer of silicon 152. The chemical structure of the silicon layer 152 is primarily comprised of silicon-silicon bonds, however, at the surface of the silicon layer 152, many of the silicon atoms are terminated by hydrogen atoms. The hydrogen terminated silicon surface layer is a hydrophobic layer of low surface energy that tends to stick to other hydrophobic surfaces such as to the face of robotic pick-up tips. It is disclosed herein that hydrophobic, hydrogen terminated silicon layer 152 does not bond well to adhesive paste 160, especially when the bond is cured for a short period of time in a snap curing process.

Figure 3B:
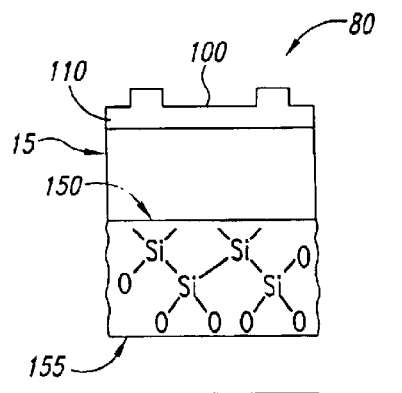
Figure 3C:
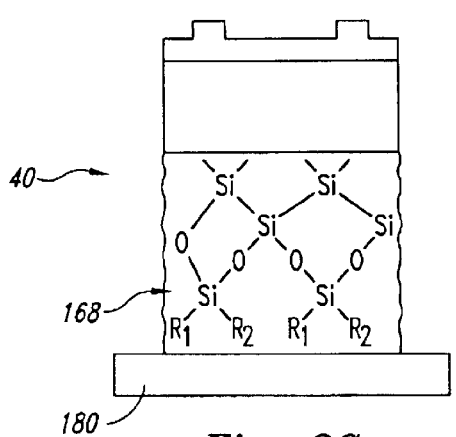

To improve binding to the adhesive, the semiconductor die is contacted with an oxidizing environment in oxidation step 15, which converts the hydrogen terminated silicon surface layer 152 to a silicon dioxide layer 155 as depicted in FIG. 3B. In contrast to the silicon surface layer 152, the silicon dioxide surface layer 155 is a hydrophilic layer of high surface energy, primarily terminated by oxygen residues. Oxidation step 15 may also result in the presence of some hydroxyl residues on the silicon dioxide layer 155, however, these are small in comparison to the oxygen terminated silicon dioxide residues and do not affect the usefulness of the invention. The silicon dioxide surface layer 155 is a superior chemical layer for adhering to an adhesive paste 160 with or without the presence of some hydroxyl residues. Example suitable adhesive pastes 160 are polyimide pastes such as bis-maleimide (BMI). Another example of a suitable adhesive paste 160 is an epoxy paste commonly available under the trade name ABLEBOND.™ These adhesives, like most adhesive pastes 160 used in semiconductor manufacturing, contain at least a portion of a silane coupling agent 165. The typical silane compound used in adhesive paste 160 is comprised of a silicon atom bonded to one or more hydroxyl residues (OH) and one or more hydrocarbon chains ($R_1$ and $R_2$). The number of hydrocarbon chains or hydroxyl residues or the exact chemical composition of the silane 165 used in adhesive paste 160 is not critical. Moreover, although preferred, it is not necessary to use a silane 165 containing adhesive paste 160. However, one role of the hydrophilic silicon dioxide surface is readily illustrated by reference to its interaction with a silane 165 containing adhesive paste 160 during the curing step 40, which is depicted in FIG. 3C and in the flow diagram in FIG. 4.

In the curing step 40 the hydoxyl groups of the silane 165 containing adhesive 160 reacts with the silicon dioxide layer 155 to form a siloxy lattice 168 where the silicon atoms are linked to one another through oxygen atoms. The formation of such a lattice using silicon dioxide surface layer 155 is superior to the formation of the lattice using silicon surface layer 152, at least in-part, because the rate of the reaction is slower with the silicon layer and in part because the depth that the silane penetrates into the silicon layer is less than the rate of reaction and depth of penetration obtained with the hydrophilic silicon dioxide layer 155. The formation of a silicon dioxide layer 155 on the back surface 150 of the semiconductor die 80 therefore reduces the time required for complete curing and increases the strength of the adhesion. Accordingly, the methods disclosed herein are particularly beneficial when combined with snap curing type of processes because the adhesive can be reliably cured in less than 5 minutes, or less than 1 minute, or typically in about 10 to 30 seconds of incubation at temperatures of about 140° C. to 220° C. or greater.

Figure 4:
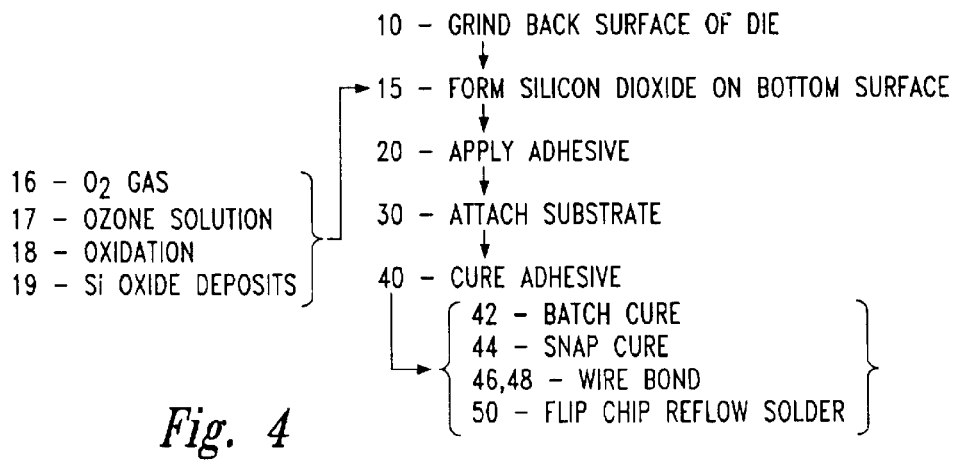
FIG. 4 is a flow chart that depicts an embodiment of the method of the present invention.

FIG. 4 depicts a general embodiment of the method of this invention. After the back surface of the semiconductor die is ground 10, a layer of silicon dioxide is formed 15 on the back surface of the semiconductor die. The silicon dioxide layer may be formed any time prior to application of the adhesive. In one embodiment, the silicon dioxide layer is formed after grinding of the wafer and before the wafer is diced into singular die. In another embodiment, the silicon dioxide layer is formed on individual semi-conductor die after the wafer has been diced. In any case, the adhesive paste 160 is applied 20 to contact at least one of the silicon dioxide surface 155 and the surface 180 of the substrate 170, the die is then attached 30 to the substrate and the adhesive is cured 40. Although FIG. 4 depicts a sequence of steps, one of ordinary skill in the art will recognize that the sequence can be altered and yet accomplish the same results. For example, the adhesive paste 160 can be first applied to the substrate and then the substrate attached to the back surface of the semiconductor die. In either case, the adhesive paste 160 is applied between the silicon dioxide layer 155 and the substrate.

It is preferred that the silicon oxide layer 155 formed on the back surface 150 of the semiconductor die 80 be at least 10 angstroms in thickness. It is also preferred that the thickness be uniform to ±5 angstroms. A suitable silicon dioxide layer 155 is about 15±5 angstroms in thickness although silicon dioxide layers 155 of greater thickness with less uniformity are also suitable. There are a variety of ways to form a silicon dioxide layer 155 of requisite thickness on the back surface 150 of the semiconductor die 80. For purposes of increasing the speed of manufacturing throughput it is desirable to form the silicon dioxide layer 155 as quickly as possible. In various embodiments, the silicon dioxide layer 155 should be formed within a reaction period of 72 hours or less, within 24 hours or less, within 6 hours or less, within 1 hour or less, and more preferably, in less than 10 minutes, for example within 2–10 minutes or within 5 minutes.

In preferred embodiments, the silicon dioxide layer 155 is formed in a reaction period of less than 1 hour by contacting the semiconductor die with ozone. In one embodiment 16 the semiconductor die is contacted with an atmosphere containing at least about 1 vol % of gaseous ozone at a temperature of about 20° C. to about 30° C. The greater the amount of ozone the shorter the reaction period needed to form the ozone layer of desired thickness. The ozone may be present in a gas mixture from about 1 to 100 vol % and most typically about 5 to about 20 vol % in a mixture with other gasses. In some embodiments, the semiconductor die is contacted with a plasma comprised of a noble gas and ozone. A variety of plasma based ozone generators are known in the art. One suitable example is a generator where pure oxygen gas is excited by ultraviolet radiation to generate ozone. Another suitable example is an atmosphere comprising argon plasma and ozone. A mixture of argon and oxygen is formed into a gaseous plasma containing ozone by exposing the mixture with electromagnetic radiation such as high frequency radio waves or ultraviolet light. When a semiconductor die is exposed to ozone according to these embodiments, the silicon layer 152 is converted to a silicon dioxide layer 155 of at least about 10 angstroms thickness in a time period of between 30 seconds and 10 minutes, typically, less than about 10 minutes, and most typically in about 2 to about 5 minutes.

In another embodiment 17, the semiconductor die is contacted with a mixture of ozone and a liquid. Suitable liquids include but are not limited to aliphatic or cyclic hydrocarbons of up to about 12 carbons as well as alcohols, ketones, aldehydes and other derivatives of the same. In a preferred practice, the liquid comprises water or a mixture with water, but most preferably the liquid consists essentially of water and ozone. Ozone is introduced into the liquid from an ozone generator. Preferably, ozone is present in the liquid at least about 1% wt %, at least about 5 wt %, at least about 10 wt % or more preferably in a sufficient amount to saturate the liquid with ozone. Typical liquid ozone mixtures suitable for use in the present methods contain at least about 5 to about 10 wt % ozone. In these embodiments, the silicon layer is converted to a silicon dioxide layer of the requisite thickness in a time period of less than about 10 minutes, less than about 5 minutes, about 2 to about 10 minutes, and most typically in about 2 to about 5 minutes.

One added benefit from forming the silicon dioxide layer on the back surface of the semiconductor die is that the silicon dioxide layer does not stick to the hydrophobic surface of the pick-up tips during robotic transfer operations. Another added benefit of contacting the semiconductor die with ozone, especially ozone in liquid mixture with water, is that the ozone cleans hydrocarbons, fluorocarbons, and other contaminating residues from the surface of the bonding pads which are typically comprised of metal such as aluminum and/or an oxide of a metal such as aluminum oxide.

Alternative methods of oxidizing the back layer of a semiconductor die may also be used. In one embodiment, the semiconductor die is contacted in an atmosphere having at least about 16% oxygen at about room temperature or greater for a time period sufficient to convert the silicon layer to a uniform silicon dioxide layer of at least about 10 angstroms thickness. When incubated in the ordinary atmospheric environment comprising about 16% oxygen at standard temperature and pressure, the time required to form the silicon dioxide layer of the requisite thickness is at least about 72 hours after grinding of the silicon back surface. While this native air oxidation process can be used to form a silicon dioxide layer on the back surface of a semiconductor die, it is difficult to regulate and requires at least about 72 hours to ensure that a silicon dioxide layer of sufficient thickness and uniformity is formed.

For purposes of increasing manufacturing through-put, it is preferred that the silicon dioxide surface layer be formed in a time period of less than 72 hours. In one embodiment of native oxidation, the time period is shortened to less than 72 hours by increasing the temperature and/or increasing the oxygen content of the incubating atmosphere in a thermal oxidation procedure. Thermal oxidation of silicon is well known in the art. Typically, a silicon dioxide layer of the requisite thickness is formed in a time period of less than about 24 hours by increasing the temperature to about 200° C. or greater and increasing the oxygen content to about 50% or more.

The foregoing methods depicted in FIG. 4 form a silicon dioxide layer in step 15 where an existing silicon layer on the back surface of the die is converted to a silicon dioxide layer by exposing the semiconductor die to ozone gas 16. ozone solution 17 or oxidizing environment 18. Other embodiments include any surface treatment 19 that will deposit a silicon dioxide layer on the back surface including, but not limited to, traditional chemical vapor deposition (CVD), photon enhanced CVD, plasma enhanced CVD and epitaxiael processes used to deposit silicon dioxide 19 on a surface of a substrate. Examples of these practices include contacting the back surface of the semiconductor die with silane or a silicon halide in the presence of oxidizing reagents such as $O_2$, $H_2O$, $N_2O$ or $CO_2$ in an environment that includes temperature and time conditions selected to deposit the silicon dioxide layer on the back surface of the semiconductor die to a thickness of at least about 10 angstroms.

Example reaction conditions for depositing silicon dioxide from silane or halogenated silicon include contacting the semiconductor die with the silane or halgoenated silcon in an environment that includes $O_2$, $N_2O$ or $CO_2$ at a temperature of about 200° C. to about 600° C. for a time sufficient to deposit a silicon dioxide layer of at least 10 angstroms thick. Typical silicon halides include $SiCl_2$, $SiCl_4$, $SiBr_2$ and $SiBr_4$. In certain embodiments using silicon halides, an acid such as HCL or HBr may be added to facilitate the oxidation reactions which result in the production of silicon dioxide.

Still another example method is to deposit the silicon dioxide layer using pyrolytic decomposition of an alloxy silane such as tetraethoxysilane (TEOS). TEOS decomposition to form silicon dioxide on a surface is also well known in the art, and typically includes contacting the surface with TEOS at a temperature of about 400° C. to about 500° C., most typically at about 450° C. for a time period sufficient to form a silicon dioxide layer of at least about 10 angstroms thick on the back surface of the semiconductor die.

In another aspect of the invention, any of the forgoing methods of forming silicon dioxide layer 155 in oxidation step 15 are used in combination with a variety of curing steps 40. In one embodiment, the adhesive is cured in a batch curing step 42. In a preferred embodiment, the adhesive is cured in a snap curing step 44 that includes heating the semiconductor die, adhesive and substrate at a temperature of about 110° C. to about 220° C. for a curing period of about 10 seconds to about 1 minute. Preferred snap curing processes 44 include heating the semiconductor die, adhesive and substrate to about 110° C. to about 150° C. for about 10 to about 30 seconds, heating to about 130° C. for about 30 seconds, or heating to about 150° C. for about 10 seconds. In another preferred embodiment, the snap curing process is conducted in a wire bonding machine that includes a heating step 46, which may optionally be followed by a wire bonding step 48 that includes further heating.

One of ordinary skill in the art will recognize other methods of curing the adhesive that are adaptable to the particular design of the semiconductor die and substrate to which it will be attached. For example, it is sometimes desirable to use a "flip-chip" construction instead of a wire bonding construction. In flip-chip construction, the semiconductor die is inverted and the bonding wire 130 between the bonding pad 120 and the conductive members 140 of the substrate 170 is replaced by a direct electrical contact between the bonding pad 120 and the conductive member 140. A semiconductor of flip chip construction may also include bonding the back surface of the semiconductor die to another substrate, particularly another semiconductor die in stacked die assemblies as illustrated in FIG. 5. The flip-chip electrical contact is typically formed by placing a solder ball between the bonding pad and the conductive member 140, then heating the assembly in a solder reflow oven under ordinarily solder reflow conditions of time and temperature. Example heating protocols are recommended in Jedec standards for solder reflow, which are incorporated herein by reference, and may be obtained from Jedec Solid State Technology Association, Arlington Va., or over the Internet, at http://www.jedec.org. One such report for solder reflow conditions is J#SPD 020A which shows one profile that raises temperature ranges from about room temperature to about 260° C. over a time period of about 200 seconds. A solder reflow oven is a suitable device for curing the adhesive according the present invention and can be used alone, or in combination with flip-chip bonding to cure the adhesive between the back surface 150 of the semiconductor die and the substrate 170.

Figure 5A:
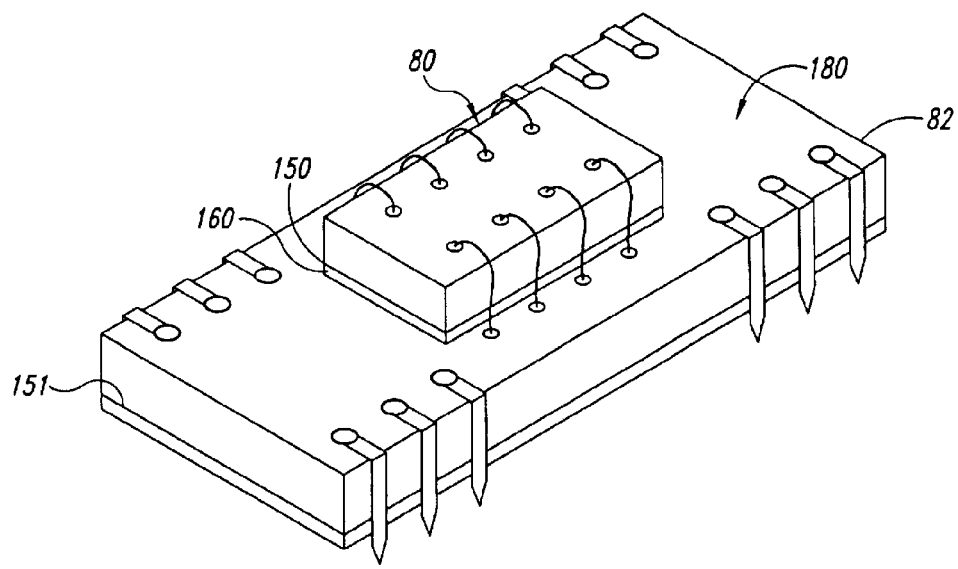
FIG. 5 is an isometric view of a stacked semiconductor die assembly made according to the methods of the present invention.
Figure 5B:
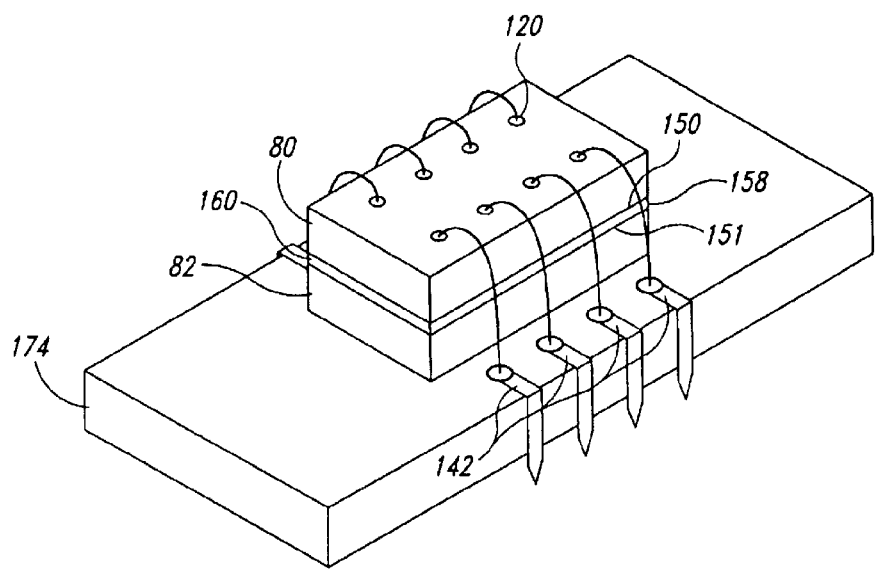

FIG. 5 depicts embodiments of a stacked die assembly where the back surface 150 of one semiconductor die 80 is attached to the front surface 180 (FIG. 5A) or back surface 151 (FIG. 5B) of a second semiconductor die 82. In these embodiments, the substrate to which the back surface of the first semiconductor die is attached is a surface of a second semiconductor die. FIG. 5B depicts the second semiconductor die 82 attached to lead frame substrate 174 in a flip-chip configuration where the bonding pads of the second semiconductor die 82 (obscured in the FIG. 5B) are directly soldered to the leads 142 of the lead frame 174. The solder bumps form the principle points of adhesion between the substrate 174 and the second semiconductor die 82, however, other surfaces of the first 80 and second 82 semiconductor die are bonded by the adhesive 160. In either of these embodiments, the back surfaces 150 and 151 of the semiconductor die are treated to form a silicon dioxide surface layer to enhance the strength of the bond formed with the adhesive paste 160.

Figure 6A:
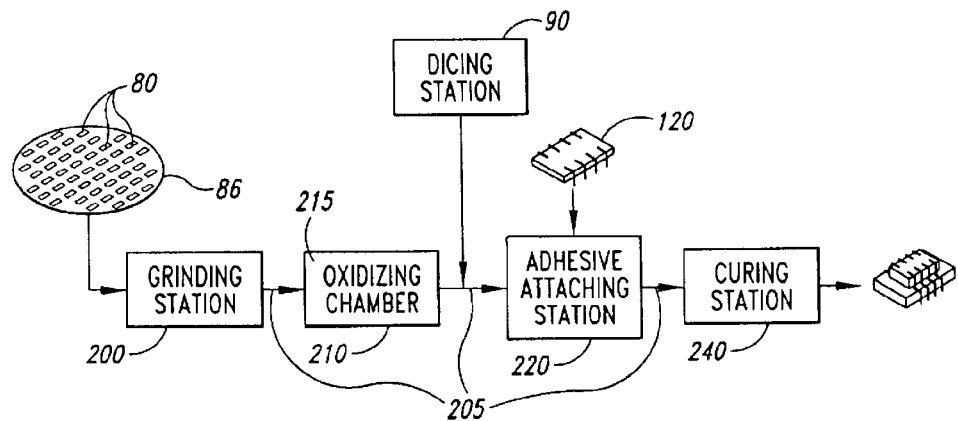
FIG. 6 is a schematic diagram illustrating systems for accomplishing the methods of this invention.
Figure 6B:
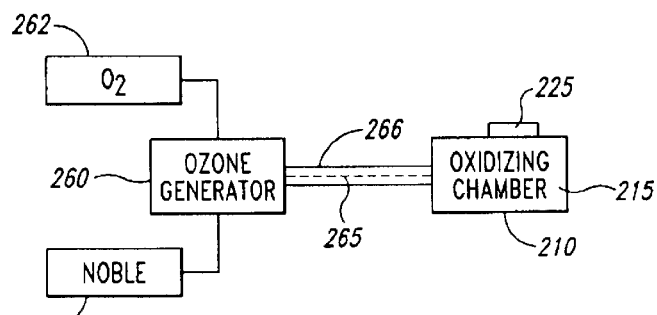
Figure 6C:
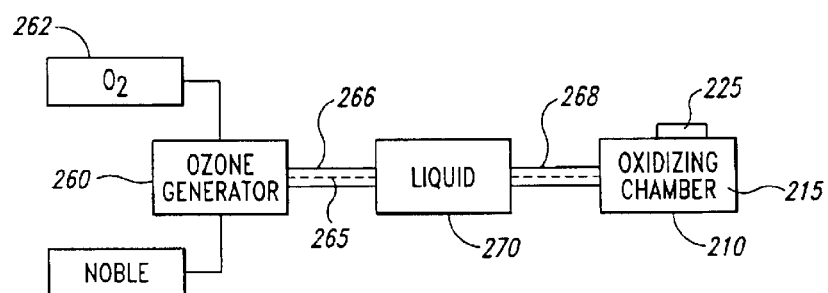

Also provided herein are systems for implementing the foregoing methods for attaching a semiconductor die to a substrate, which are illustrated in FIG. 6. In one embodiment, the system includes a grinding station 200 that receives a wafer 86 containing the semiconductor die 80 by transfer means 205. Transfer means 205 may be any automated machine or combination of machines for handling semiconductor components, for example, conveyor belts, robotic arms, pick-up tips and the like. The back surface of the semiconductor die 80 is ground at grinding station 200 and transferred to oxidizing chamber 210. Oxidizing chamber 210 is interposed between grinding station 200 and adhesive attachment station 220, and is adapted to receive the ground semiconductor die 80 from transfer means 205 and configured to incubate the die in an environment that forms a silicon dioxide layer of at least about 10 angstrom thick on the back surface of the die 80. The wafer 86 containing semiconductor die 80 is diced into individual die at dicing station 90, optionally after grinding station 200 or after oxidation station 210. The system may further include adhesive attachment station 220 adapted to receive the oxidized semiconductor die 80 and to receive the substrate 170 and configured apply adhesive 160 to the surface of the substrate 170 or semiconductor die 80 and to attach the substrate 170 thereto. Finally, the system may also include curing station 240 adapted to receive the semiconductor die 80 with attached substrate 170 and configured to incubate the same at a temperature of at least about 110° C. for a curing period of at least about 10 seconds. Curing station 240 may be a hot plate, an oven, a solder reflow machine, a wire bonding machine, or any other component that can apply a curing temperature to the substrate/semiconductor die assembly.

In one embodiment, oxidizing chamber 210 contains oxidizing environment 215 that includes at least about 1 wt % ozone. One such oxidizing environment 215 is provided by ozone generator 260 that supplies a gas mixture 265 containing ozone made by mixing oxygen gas 262 with or without a noble gas 264 and exposing the gas to high frequency radio waves or ultraviolet light. The formation of the ozone 265 may occur within the oxidizing chamber 210 or be supplied thereto by a port 266. The oxidizing chamber 210 may optionally be configured to control the temperature of the oxidizing environment 215 with thermostat 225, for example to incubate the semiconductor die at about 20 to 30° C. In another embodiment, the oxidizing chamber 210 contains a mixture of ozone 265 and a liquid 270 and preferably contains a mixture of water and about 1 wt % ozone. In a preferred embodiment, the system is configured to bubble ozone containing gas into the water to form an oxidizing environment 215 comprised of saturated ozone in water. The liquid 270 mixture with ozone 265 may be formed by combining the ozone 265 and the liquid 270 to form the mixture in the oxidizing chamber 210 or by supplying the mixture to the oxidizing chamber 210 through port 268. It is understood that while the system components are depicted in FIG. 6 as separate elements, two or more of the elements may be combined to form an integrated unit. For example, oxidizing chamber 210 may be configured to provide ozone gas 265, liquid 270 and all necessary components of ozone generation 260 in one unit.

From the foregoing it will be appreciated that, although specific embodiments of the invention have been described herein for purposes of illustration, various modifications may be made without deviating from the spirit and scope of the invention. Accordingly, the invention is not limited except as by the following claims.

What is claimed is:

1. A method of adhering a semiconductor die to a substrate, comprising
providing a semiconductor die having a back surface comprised of a silicon layer, and a front surface comprised of a cover layer;
contacting the back surface of the semiconductor die with ozone to form a silicon dioxide layer on the back surface;
dicing a wafer containing a plurality of semiconductor die to form individual semiconductor die after the silicon dioxide layer has been formed on the back surface;
applying an adhesive containing a silicone compound to at least one of the silicon dioxide layer and the substrate; and
curing the adhesive to adhere the semiconductor die to the substrate.

2. The method of claim 1 wherein the semiconductor die is contacted with a gas comprised of ozone.

3. The method of claim 2 wherein the gas includes a plasma of a noble gas.

4. The method of claim 3 wherein the noble gas is argon.

5. The method of claim 1 wherein the semiconductor die is contacted with a liquid comprised of dissolved ozone.

6. The method of claim 5 wherein the liquid is comprised of water and at least about 1% ozone.

7. The method of claim 5 wherein the liquid is comprised of water and at least about 5% ozone.

8. The method of claim 5 the liquid is comprised of water and at least about 10% ozone.

9. The method of claim 5 wherein the liquid is comprised of water saturated with ozone.

10. The method of claim 1 wherein the semiconductor die is contacted with the ozone for a reaction period sufficient to form a silicon dioxide layer having a thickness of at least about 10 angstroms.

11. The method of claim 10 wherein the silicon dioxide layer is a uniform layer of about 15±5 angstrom thickness.

12. The method of claim 10 wherein the reaction period is about 30 seconds to about 20 minutes.

13. The method of claim 10 wherein the reaction period is about 1 minute to about 10 minutes.

14. The method of claim 10 wherein the reaction period is about 5 minutes.

15. The method of claim 1 wherein the back surface of the semiconductor die is ground on a grinding machine before the semiconductor die is contacted with ozone.

16. The method of claim 1 wherein the adhesive is selected from the group consisting of BMI and epoxy.

17. The method of claim 1 wherein curing of the adhesive comprises heating the semiconductor die to a temperature of about 110° C. to about 220° C. for a curing period of about 10 seconds to about 1 minute.

18. The method of claim 17 wherein the temperatures is about 110° C. to about 150° C. and the curing period is about 10 seconds to about 30 seconds.

19. The method of claim 17 wherein the temperatures is about 130° C. and the curing period is about 30 seconds.

20. The method of claim 17 wherein the temperatures is about 150° C. and the curing period is about 10 seconds.

21. The method of claim 1 wherein curing of the adhesive is done in a wire bonding machine and the semiconductor die is preheated to a first temperature of about 130° C. for a curing period of about 10 seconds to about 30 seconds, and the temperature is raised to a second temperature of about 150° C. for a time sufficient to bond the wires to bonding pads on the semiconductor die.

22. The method of claim 1 wherein curing of the adhesive is done in a solder reflow oven where the semiconductor die is incubated under conditions sufficient to form a solder bond between electrical contacts on the semiconductor die.

23. The method of claim 1 wherein the substrate comprises a semiconductor lead frame assembly.

24. The method of claim 1 wherein the substrate comprises another semiconductor die.

25. A method of adhering a semiconductor die to a substrate, comprising
providing a wafer comprised of a plurality of semiconductor die having a back surface comprised of a silicon layer, and a front surface comprised of a cover layer;
contacting the back surface of the wafer with ozone to form a silicon dioxide layer on the back surface;
dicing the wafer to obtain the semiconductor die after the silicon dioxide layer is formed;
applying an adhesive containing a silicone compound to at least one of the back surface of and the substrate; and
curing the adhesive to adhere the semiconductor die to the substrate.

26. The method of claim 25 wherein the semiconductor die is contacted with a gas comprised of ozone.

27. The method of claim 26 wherein the gas includes a plasma of a noble gas.

28. The method of claim 27 wherein the noble gas is argon.

29. The method of claim 25 wherein the semiconductor die is contacted with a liquid comprised of dissolved ozone.

30. The method of claim 29 wherein the liquid is comprised of water and at least about 1% ozone.

31. The method of claim 29 wherein the liquid is comprised of water and at least about 5% ozone.

32. The method of claim 29 wherein the liquid is comprised of water and at least about 10% ozone.

33. The method of claim 29 wherein the liquid is comprised of water saturated with ozone.

34. The method of claim 25 wherein the semiconductor die is contacted with the ozone for a reaction period sufficient to form a silicon dioxide layer having a thickness of at least about 10 angstroms.

35. The method of claim 34 wherein the silicon dioxide layer is a uniform layer of about 15±5 angstrom thickness.

36. The method of claim 34 wherein the reaction period is about 30 seconds to about 20 minutes.

37. The method of claim 34 wherein the reaction period is about 1 minute to about 10 minutes.

38. The method of claim 34 wherein the reaction period is about 5 minutes.

39. The method of claim 35 wherein the back surface of the wafer die is ground on a grinding machine before the back surface is contacted with ozone.

40. The method of claim 25 wherein curing of the adhesive comprises heating the semiconductor die to a temperature of about 110° C. to about 220° C. for a curing period of about 10 seconds to about 1 minute.

41. The method of claim 40 wherein the temperatures is about 110° C. to about 150° C. and the curing period is about 10 seconds to about 30 seconds.

42. The method of claim 40 wherein the temperatures is about 130° C. and the curing period is about 30 seconds.

43. The method of claim 40 wherein the temperatures is about 150° C. and the curing period is about 10 seconds.

44. The method of claim 25 wherein curing of the adhesive is done in a wire bonding machine and the semiconductor die is preheated to a first temperature of about 130° C. for a curing period of about 10 seconds to about 30 seconds, and the temperature is raised to a second temperature of about 150° C. for a time sufficient to bond the wires to bonding pads on the semiconductor die.

45. The method of claim 25 wherein curing of the adhesive is done in a solder reflow oven where the semiconductor die is incubated under conditions sufficient to form a solder bond between electrical contacts on the semiconductor die.

46. The method of claim 25 wherein the substrate comprises a semiconductor lead frame assembly.

47. The method of claim 25 wherein the substrate comprises another semiconductor die.

48. The method of claim 25 wherein the adhesive is selected from the group consisting of BMI and epoxy.

49. A method of adhering a semiconductor die to a substrate, comprising
providing a wafer containing a plurality of semiconductor die and having a back surface and a front surface opposite the back surface, the front surface being comprised of a cover layer;
forming a silicon dioxide layer of at least about 10 angstroms thickness on the back surface of the semiconductor die;
dicing the wafer to form individual semiconductor die after the silicon dioxide layer has been formed on the back surface;
applying an adhesive containing a silicone compound to at least one of the silicon dioxide layer and the substrate; and
curing the adhesive to adhere the semiconductor die to the substrate.

50. The method of claim 49 wherein silicon dioxide layer is formed in a time period is less than 72 hours.

51. The method of claim 49 wherein silicon dioxide layer is formed in a time period is less than 24 hours.

52. The method of claim 49 wherein the time period is less than 6 hours.

53. The method of claim 49 wherein the time period is less than 1 hour.

54. The method of claim 49 wherein the time period is less than about 10 minutes.

55. The method of claim 49 wherein the time period is less than about 5 minutes.

56. The method of claim 49 the time period is about 2 to about 10 minutes.

57. The method of claim 49 wherein the time period is about 2 to about 5 minutes.

58. The method of claim 49 wherein the back surface of the semiconductor die is ground on a grinding machine before the semiconductor die is contacted with ozone.

59. The method of claim 49 wherein the adhesive is selected from the group consisting of BMI and epoxy.

60. The method of claim 49 wherein curing of the adhesive comprises heating the semiconductor die to a temperature of about 110° C. to about 220° C. for a curing period of about 10 seconds to about 1 minute.

61. The method of claim 60 wherein the temperatures is about 110° C. to about 150° C. and the curing period is about 10 seconds to about 30 seconds.

62. The method of claim 60 wherein the temperatures is about 130° C. and the curing period is about 30 seconds.

63. The method of claim 60 wherein the temperatures is about 150° C. and the curing period is about 10 seconds.

64. The method of claim 49 wherein curing of the adhesive is done in a wire bonding machine and the semiconductor die is preheated to a first temperature of about 130° C. for a curing period of about 10 seconds to about 30 seconds, and the temperature is raised to a second temperature of about 150° C. for a time sufficient to bond the wires to bonding pads on the semiconductor die.

65. The method of claim 49 wherein curing of the adhesive is done in a solder reflow oven where the semiconductor die is incubated under conditions sufficient to form a solder bond between electrical contacts on the semiconductor die.

66. The method of claim 49 wherein the substrate comprises a semiconductor lead frame assembly.

67. The method of claim 49 wherein the substrate comprises another semiconductor die.

68. The method of claim 49 wherein forming the silicon dioxide layer includes depositing the layer of silicon dioxide on the back surface of the semiconductor die.

69. The method of claim 49 wherein forming the silicon dioxide layer includes contacting the semiconductor die with an oxidizing environment to convert a silicon layer on the back of the semiconductor die to the silicon dioxide layer.

70. A method of adhering a semiconductor die to a substrate, comprising
providing a wafer containing a plurality of semiconductor die and having a back surface comprised of a silicon layer, and a front surface comprised of a cover layer;
contacting the back surface of the semiconductor die with an oxidizing environment to convert the silicon layer to a silicon dioxide layer of at least 10 angstroms thickness in a time period of less than 72 hours;
dicing the wafer to form individual semiconductor die after the silicon dioxide layer has been formed on the back surface;

applying an adhesive containing a silicone compound to at least one of the oxidized back surface and the substrate; and curing the adhesive to adhere the semiconductor die to the substrate.

71. A method of adhering a semiconductor die to a substrate, comprising providing a wafer containing a plurality of semiconductor die and having a back surface comprised of a silicon layer, and a front surface opposite the back surface, the front surface being comprised of a cover layer;

contacting the back surface of the semiconductor die with a solution containing ozone in water to form a silicon dioxide layer of at least about 10 angstroms thickness on the back surface;

dicing the wafer to form individual semiconductor die after the silicon dioxide layer has been formed on the back surface;

applying an adhesive containing a silicone compound to at least one of the oxidized back layer and the substrate; and curing the adhesive to adhere the semiconductor die to the substrate in a curing period of less than about 5 minutes.

72. A method of adhering a semiconductor die to a substrate, comprising providing a wafer containing a plurality of semiconductor die and having a back surface comprised of silicon and a front surface comprised of a cover layer;

contacting the back surface of the semiconductor die with a gas mixture comprised of ozone and a noble gas to form a silicon dioxide layer of at least about 10 angstroms thickness on the back surface;

dicing the wafer to form individual semiconductor die after the silicon dioxide layer has been formed on the back surface;

applying an adhesive containing a silicone compound to at least one of the oxidized back layer and the substrate; and curing the adhesive to adhere the semiconductor die to the substrate in a curing period of less than about 5 minutes.

* * * * *